US010536151B1

(12) United States Patent
Zhou et al.

(10) Patent No.: US 10,536,151 B1
(45) Date of Patent: Jan. 14, 2020

(54) ULTRA-LOW-POWER INJECTION LOCKED OSCILLATOR FOR IQ CLOCK GENERATION

(71) Applicant: Xilinx, Inc., San Jose, CA (US)

(72) Inventors: Lei Zhou, San Jose, CA (US); Jinyung Namkoong, San Jose, CA (US); Stanley Y. Chen, Cupertino, CA (US); Parag Upadhyaya, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 27 days.

(21) Appl. No.: 16/024,473

(22) Filed: Jun. 29, 2018

(51) Int. Cl.
*H03L 7/08* (2006.01)
*G06F 1/06* (2006.01)
*H03K 3/03* (2006.01)

(52) U.S. Cl.
CPC .............. *H03L 7/0802* (2013.01); *G06F 1/06* (2013.01); *H03K 3/0322* (2013.01)

(58) Field of Classification Search
CPC .................................................... H03L 7/0802
USPC ......................................................... 331/1 A
See application file for complete search history.

(56) References Cited

U.S. PATENT DOCUMENTS

2017/0040941 A1* 2/2017 Chatwin ............... H03K 3/0315
2017/0366195 A1* 12/2017 Kim ...................... H03K 3/0322

OTHER PUBLICATIONS

Raj, Mayank et al., A 4-to-11GHz Injection-Locked Quarter-Rate Clocking for an Adaptive 153fJ/b Optical Receiver in 28nm FDSOI CMOS, pp. 404-406, IEEE International Solid-State Circuits Conference, Feb. 2015.
Chang, H.-C., et. al., "Phase Noise in Externally Injection-Locked Oscillator Arrays," IEEE Trans. Microwave Theory Tech., vol. 45, pp. 2035-2042, Nov. 1997.

* cited by examiner

*Primary Examiner* — Joseph Chang
(74) *Attorney, Agent, or Firm* — William L. Paradice, III; Michael Quick

(57) ABSTRACT

An injection locked oscillator (ILO) circuit is disclosed. The ILO circuit may include a first clock injection stage including a first programmable inverter in series with a first self-biased inverter. The first injection stage may receive a first input clock having a first frequency and generate a first injection signal. The ILO circuit may further include a second clock injection stage including a second programmable inverter in series with a second self-biased inverter. The second injection stage may receive a second input clock signal having the first frequency and to generate a second injection signal. The ILO may further include a phase locked loop (PLL) stage including a multi-stage ring oscillator. The PLL stage may receive the first injection signal and the second injection signal and to generate an output clock signal based at least in part on the first frequency.

20 Claims, 5 Drawing Sheets

500

Provide a first input clock signal having a first frequency to a first clock injection stage including a first programmable inverter in series with a first self-biased inverter, and generating a first injection signal using the first clock injection stage. (502)

Provide a second input clock signal having the first frequency to a second clock injection stage including a second programmable inverter in series with a second self-biased inverter, and generating a second injection signal using the second clock injection stage. (504)

Provide the first injection signal and the second injection signal to a phase locked loop (PLL) stage comprising a multi-stage ring oscillator, the PLL stage configured to generate an output clock signal based at least in part on the first frequency. (506)

FIG. 5

ULTRA-LOW-POWER INJECTION LOCKED OSCILLATOR FOR IQ CLOCK GENERATION

TECHNICAL FIELD

Aspects of the present disclosure relate generally to oscillators, and more specifically to injection-locked oscillators (ILOs).

BACKGROUND

In a transceiver circuit, a phase locked loop (PLL) may generate one or more clock signals, for distribution across the transceiver circuit. For example, a clock distribution circuit may distribute the clock signal with multiple quadrature clock phases. Distributing these multiple quadrature clock phase signals across a circuit can consume a significant amount of power.

To avoid the power consumption of such clock distribution circuits an injection locked oscillator (ILO) may be used to generate the quadrature signals more locally.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure are directed to injection locked oscillator (ILO) circuits configured to reduce phase noise in a power-efficient manner. In one aspect, an ILO circuit is disclosed. The ILO circuit may include a first clock injection stage to receive a first input clock signal having a first frequency, and generate a first injection signal based on the first input clock signal, the input clock injection stage including a first programmable inverter in series with a first self-biased inverter. The ILO circuit may further include a second clock injection stage, including a second programmable inverter in series with a second self-biased inverter, to receive a second input clock signal having the first frequency, and to generate a second injection signal based on the second input clock signal. The ILO circuit may further include a phase locked loop (PLL) stage having a multi-stage ring oscillator, the PLL stage to receive the first injection signal and the second injection signal and generate an output clock signal based at least in part on the first frequency.

In another example, a method for operating an ILO circuit is disclosed. The method may include providing a first input clock signal, having a first frequency, to a first clock injection stage including a first programmable inverter in series with a first self-biased inverter, and generating a first injection signal based on the first input clock signal, providing a second input clock signal, having the first frequency, to a second clock injection stage including a second programmable inverter in series with a second self-biased inverter, and generating a second injection signal based on the second input clock signal, and providing the first injection signal and the second injection signal to a phase locked loop (PLL) stage including a multi-stage ring oscillator. The PLL stage is configured to generate an output clock signal based at least in part on the first frequency.

In another example, an injection locked oscillator (ILO) circuit is disclosed. The ILO circuit may include means for providing a first input clock signal, having a first frequency, to a first clock injection stage including a first programmable inverter in series with a first self-biased inverter, and generating a first injection signal based on the first input clock signal, means for providing a second input clock signal, having the first frequency, to a second clock injection stage including a second programmable inverter in series with a second self-biased inverter, and generating a second injection signal based on the second input clock signal, and means for providing the first injection signal and the second injection signal to a phase locked loop (PLL) stage including a multi-stage ring oscillator, the PLL stage configured to generate an output clock signal based at least in part on the first frequency.

BRIEF DESCRIPTION OF THE DRAWINGS

The example embodiments are illustrated by way of example and are not intended to be limited by the figures of the accompanying drawings. Like numbers reference like elements throughout the drawings and specification.

FIG. 5 is an illustrative flow chart depicting an example operation for operating an ILO circuit, in accordance with some embodiments.

DETAILED DESCRIPTION

Aspects of the present disclosure may improve the performance of an ILO by producing lower phase noise in a more power-efficient manner than conventional ILOs. More particularly, example ILOs may reduce phase noise by improving injection strength in a more power-efficient manner by incorporating programmable inverters into the injection stages of the ILO. Additionally, example ILOs may incorporate pairs of dummy buffers in stages of a ring oscillator to balance oscillation tank loading. Further, such ILOs may be incorporated into frequency tracking loops (FTLs) to adjust the locking range of the ILO to frequency lock the ILO to a differential clock input. Such FTLs may incorporate a coarse FTL to determine a coarse adjustment to the ILO oscillation frequency, and a fine quadrature locked loop (QLL) to determine a fine adjustment to the ILO oscillation frequency. These and further aspects are described below with respect to the drawings.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

Figure 1:
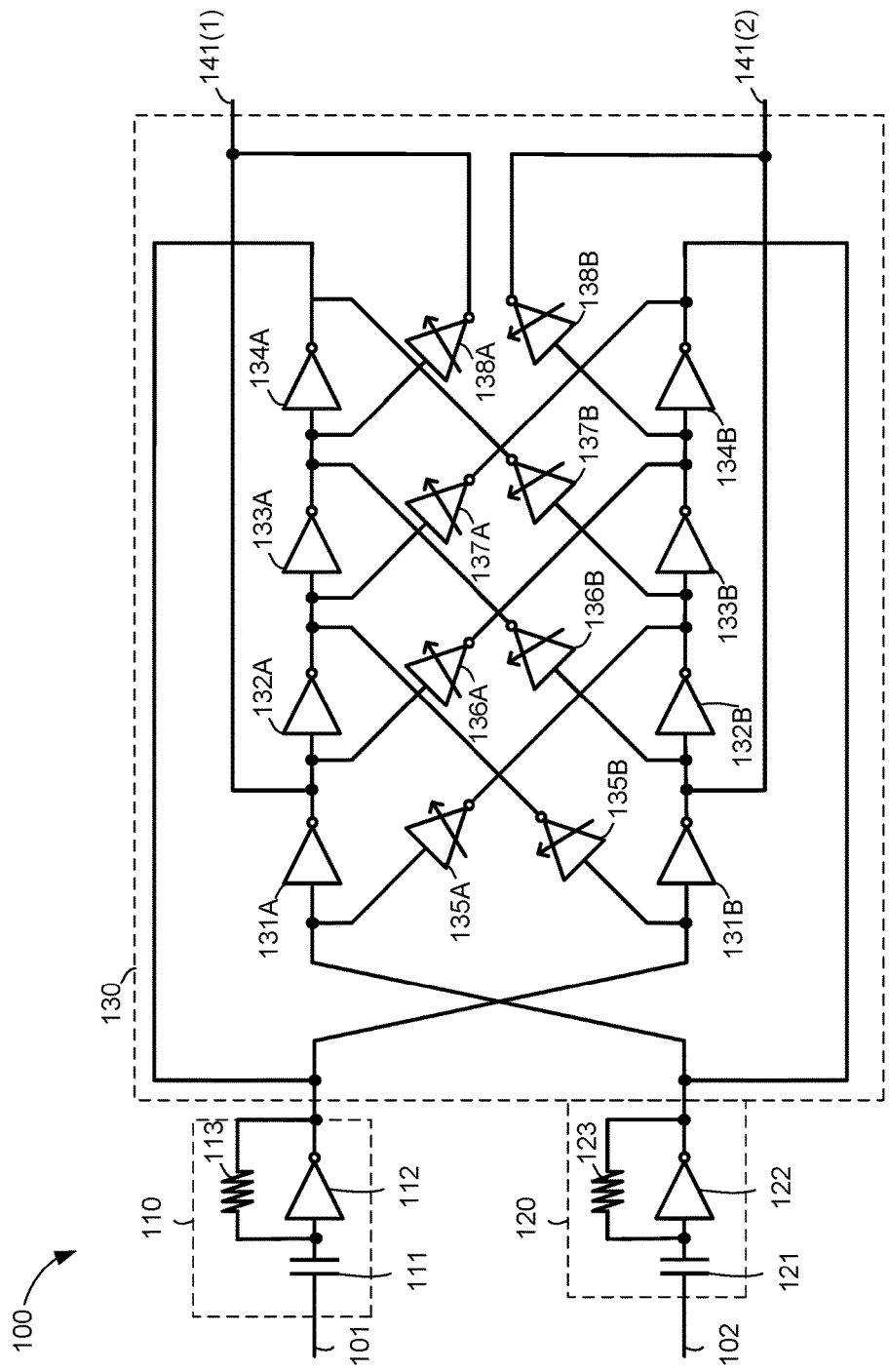
FIG. 1 is a block diagram of an injection locked oscillator (ILO) circuit.

FIG. 1 is a block diagram of an ILO circuit 100. The ILO circuit 100 is depicted as receiving a first input clock signal 101 and a second input clock signal 102. For example, the first and second input clock signals 101 and 102 may be a differential pair of clock signals that are complementary in nature. The first input clock signal may be provided to a first clock injection stage 110, and the second input clock signal may be provided to a second clock injection stage 120. The first clock injection stage 110 may include a first capacitor 111 in series with a first self-biased inverter 112 and a first bias resistor 113. Similarly, the second clock injection stage 120 may include a second capacitor 121 in series with a second self-biased inverter 122 and a second bias resistor 123. The self-biased inverters 112 and 122 may provide level shifting and signal injection for the ILO circuit 100. The output of the first injection stage 110 and the output of the second injection stage 120 may be provided to a phase locked loop (PLL) stage 130. The PLL stage 130 includes a multiple stage ring oscillator. In the example of FIG. 1, the PLL stage 130 includes a four-stage ring oscillator where a first stage includes inverters 131A, 131B, and programmable inverters 135A and 135B. Similarly, a second stage includes inverters 132A, 132B, and programmable inverters 136A and 136B, a third stage includes inverters 133A, 133B, and programmable inverters 137A and 137B, and a fourth stage includes inverters 134A, 134B, and programmable inverters 138A and 138B. The PLL stage 130 may also generate a first output signal 141(1) and a second output signal 141(2).

ILO circuits, such as ILO circuit 100 may lock a frequency of the output signals, such as output signals 141(1) and 141(2), to a frequency of the input signals, such as input clock signals 101 and 102, if the input signals are within a locking range of the ILO circuit. The locking range is a range of input signal frequencies near the free-running frequency of the PLL stage 130 for which the PLL stage 130 may acquire a frequency lock. Further, the oscillation frequency of the PLL stage 130 may be adjusted by adjusting the size of the inverters of the PLL stage 130—such as one or more of inverters 131A-134A, 131B-134B, 135A-138A, and 135B-138B.

Locking the frequency of the output signal to the frequency of the input signal may cause a reduction in phase noise for use with quadrature signals (IQ signals). This phase noise reduction is related to the injection strength, and to the bandwidth of the PLL stage 130. Higher injection strength correlates with higher bandwidth, and reduced phase noise. In ILO circuit 100, the self-biased inverters 112 and 122 may be used for level shifting and signal injection. The size of the self-biased inverters 112 and 122 may be increased to improve injection strength, and thereby reduce phase noise. However, increasing the size of the self-biased inverters 112 and 122 may result in an unacceptable increase in power consumption, particularly in light of often stringent power budgets allowed for clocking circuits. Further, the loop gain changes as the injection strength is adjusted, further complicating the design.

Accordingly, the example embodiments provide ILO circuits which may reduce phase noise in a more power-efficient manner. More particularly, rather than changing the size of the self-biased inverters, example ILO circuits may provide improved injection strength using a programmable inverter in series with the self-biased inverter. Thus, the example embodiments provide programmable injection strength without changing the loop gain as the injection strength is adjusted. Further, to balance the loading of the oscillator tank of the PLL stage, one or more pairs of dummy buffers may be incorporated into an example ILO circuit.

Figure 2:
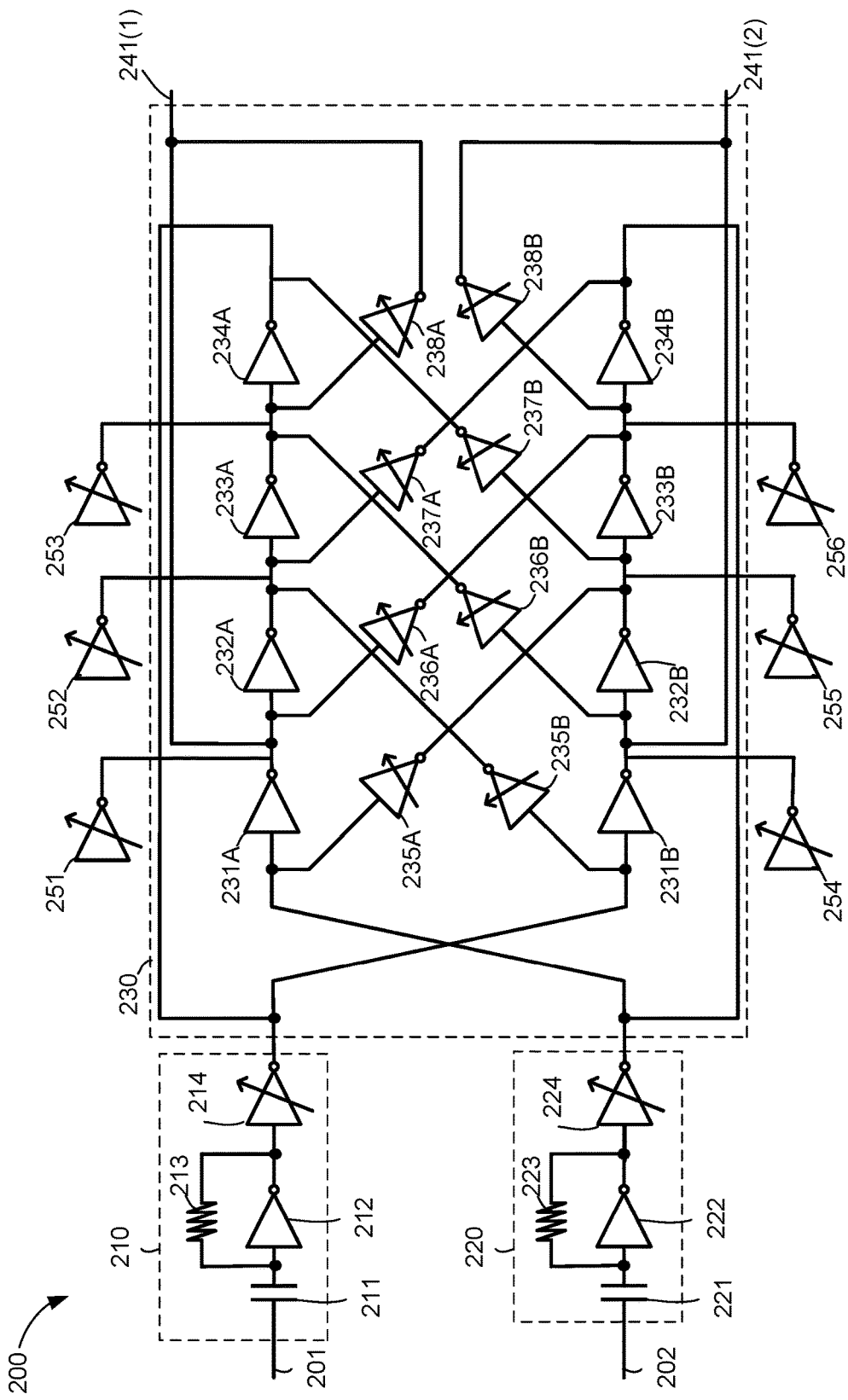
FIG. 2 is a block diagram of an example ILO circuit, in accordance with some embodiments.

FIG. 2 shows an example ILO circuit 200, according to some embodiments.

The ILO circuit 200 is depicted as receiving a first input clock signal 201 and a second input clock signal 202. For example, the first and second input clock signals 201 and 202 may be a complementary pair of differential of clock signals. The first input clock signal 201 may be provided to a first clock injection stage 210, and the second input clock signal 202 may be provided to a second clock injection stage 220. The first clock injection stage 210 may include a first capacitor 211 in series with a first self-biased inverter 212 and a first bias resistor 213. Further, the first clock injection stage 210 may include a first programmable inverter 214 in series with the first self-biased inverter 212 and the first bias resistor 213. Similarly, the second clock injection stage 220 may include a second capacitor 221 in series with a second self-biased inverter 222 and a second bias resistor 223. Further, the first clock injection stage 220 may include a second programmable inverter 224 in series with the second self-biased inverter 222 and the second bias resistor 223. In contrast to ILO circuit 100, in which the self-biased inverters 112 and 122 may be used for increasing injection strength, the programmable inverters 214 and 224 may more efficiently increase injection strength in ILO circuit 200.

The output of the first injection stage 210 and the output of the second injection stage 220 may be provided to a PLL stage 230. The PLL stage 230 includes a multiple stage ring oscillator. In the example ILO 200, the PLL stage 230 includes a four-stage ring oscillator where a first stage includes inverters 231A, 231B, and programmable inverters 235A and 235B. Similarly, a second stage includes inverters 232A, 232B, and programmable inverters 236A and 236B, a third stage includes inverters 233A, 233B, and programmable inverters 237A and 237B, and a fourth stage includes inverters 234A, 234B, and programmable inverters 238A and 238B. In contrast to PLL stage 130, the PLL stage 230 may include one or more pairs of dummy buffers 251-256, each dummy buffer coupled to the outputs of one of the stages of the ring oscillator. For example, dummy buffers 251 and 254 may be coupled to the outputs of the first stage, dummy buffers 252 and 255 may be coupled to the outputs of the second stage, and dummy buffers 253 and 256 may be coupled to the outputs of the third stage. Each pair of dummy buffers may be used to balance the loading of the oscillator tank of PLL stage 230. For example, the dummy buffers may balance the loading of the stages of the oscillator tank such that the one or more pairs of output signals of the PLL stage have appropriate relative phases.

Note that while FIG. 2 shows only a single pair of output signals (i.e., outputs 241(1) and 241(2) from ILO circuit 200), in actual implementations the ILO circuit 200 may generate any number of pairs of output signals. For example, a second pair of output signals (not shown in FIG. 2 for simplicity) may be coupled to the output of the second stage of the ring oscillator. In such an implementation, the first pair of output signals may correspond to an in phase (I and Ib) signal, while the second pair of output signals may correspond to a quadrature phase (Q and Qb) signal. Further, a third and a fourth pair of output signals may be respectively coupled to the outputs of the first and third stages. Thus, in some implementations, the ILO 200 may have 8 output signals, which may each have a differing relative phase. For example, the 8 output signals may include output signals whose phases are evenly spaced, such that an output signal is generated evenly spaced at multiples of 45 degrees. As noted above, the dummy buffers 251-256 may adjust the loading of each stage of the ILO 200 for evenly spacing the phases of each of these output signals.

Figure 3:
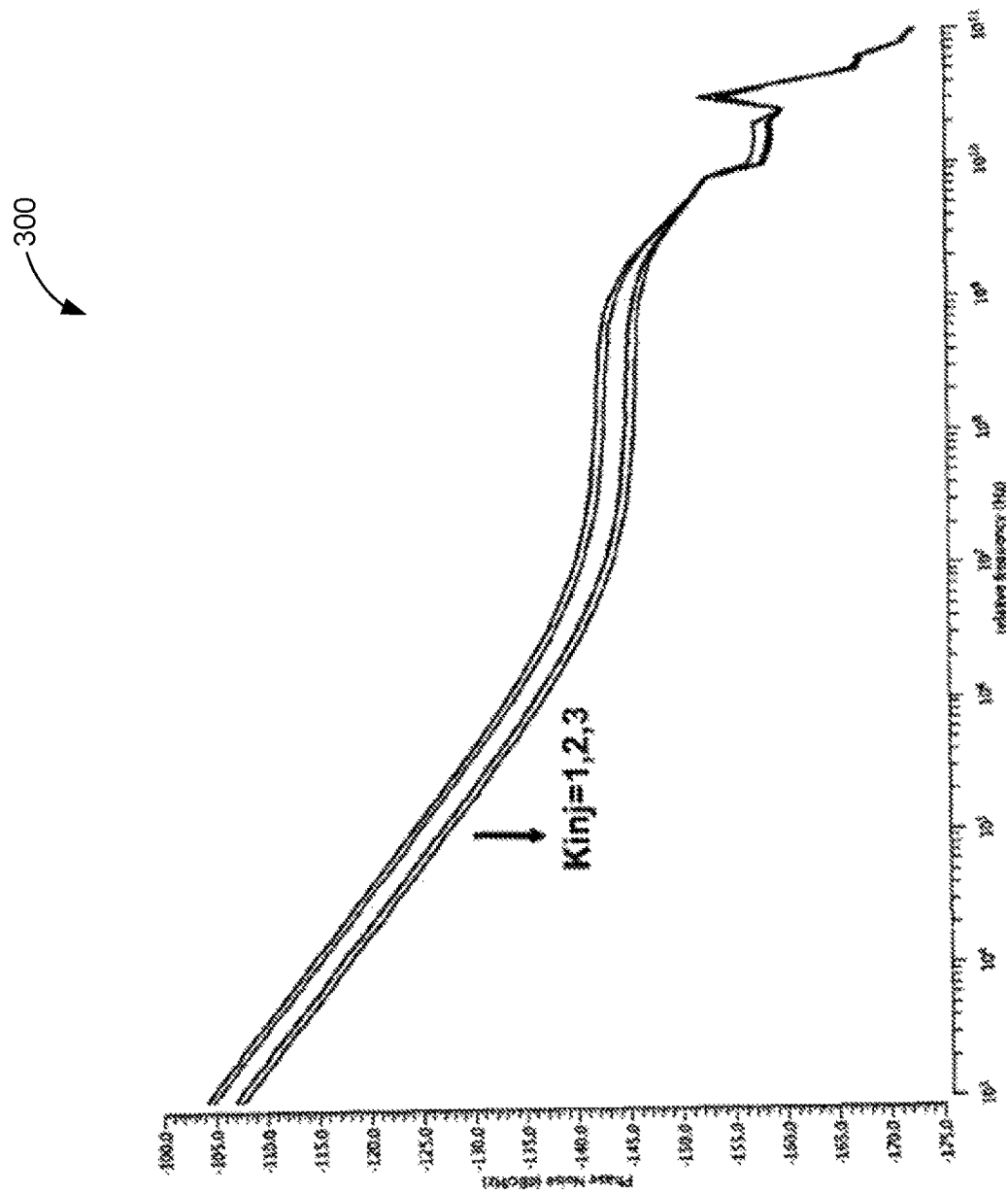
FIG. 3 shows a plot of simulated phase noise for an example ILO circuit, in accordance with some embodiments.

As noted above, rather than increasing the size of the self-biased inverters 212 and 222 in the injection stages 210 and 220, example ILO circuit 200 may instead increase injection strength using programmable inverters 214 and 214 in series with self-biased inverters 212 and 222, respectively. Accordingly, the size of the programmable inverters 214 and 224 may be increased to increase the bandwidth of the injection stages 210 and 220, and consequently reduce phase noise. FIG. 3 shows a graph 300 showing a reduction in phase noise for an example ILO circuit. With respect to FIG. 3, relative frequency is represented on the x axis, and reflects a difference in frequency between the resonant frequency of the PLL stage and the frequency of the input clock signals, while phase noise is represented on the y axis. Note that graph 300 shows several curves, each curve representing a plot of phase noise versus relative frequency for a corresponding injection coefficient $k_{inj}$, where the injection coefficient is proportional to injection power. As shown in FIG. 3, as the injection coefficient increases, phase noise is reduced.

The oscillation frequency of the PLL stage 230 may be adjusted by adjusting the size of the inverters of the PLL stage 230—such as one or more of inverters 231A-234A, 231B-234B, 235A-238A, and 235B-238B. as described above with respect to FIG. 1, adjusting the oscillation frequency of the PLL stage 230 may adjust the locking range of the ILO 200.

As discussed above, the inclusion of programmable inverters 214 and 224, as well as dummy buffers 251-256, may decrease the phase noise of the ILO circuit 200 in a more power-efficient manner than conventional, ILO circuits. However, in order for the ILO circuit 200 to lock the frequency of the output signals 241(1) and 241(2) to the frequency of input signals 201 and 202, the oscillation frequency of the PLL stage 230 should be adjusted to include the input clock signal frequency.

Figure 4:
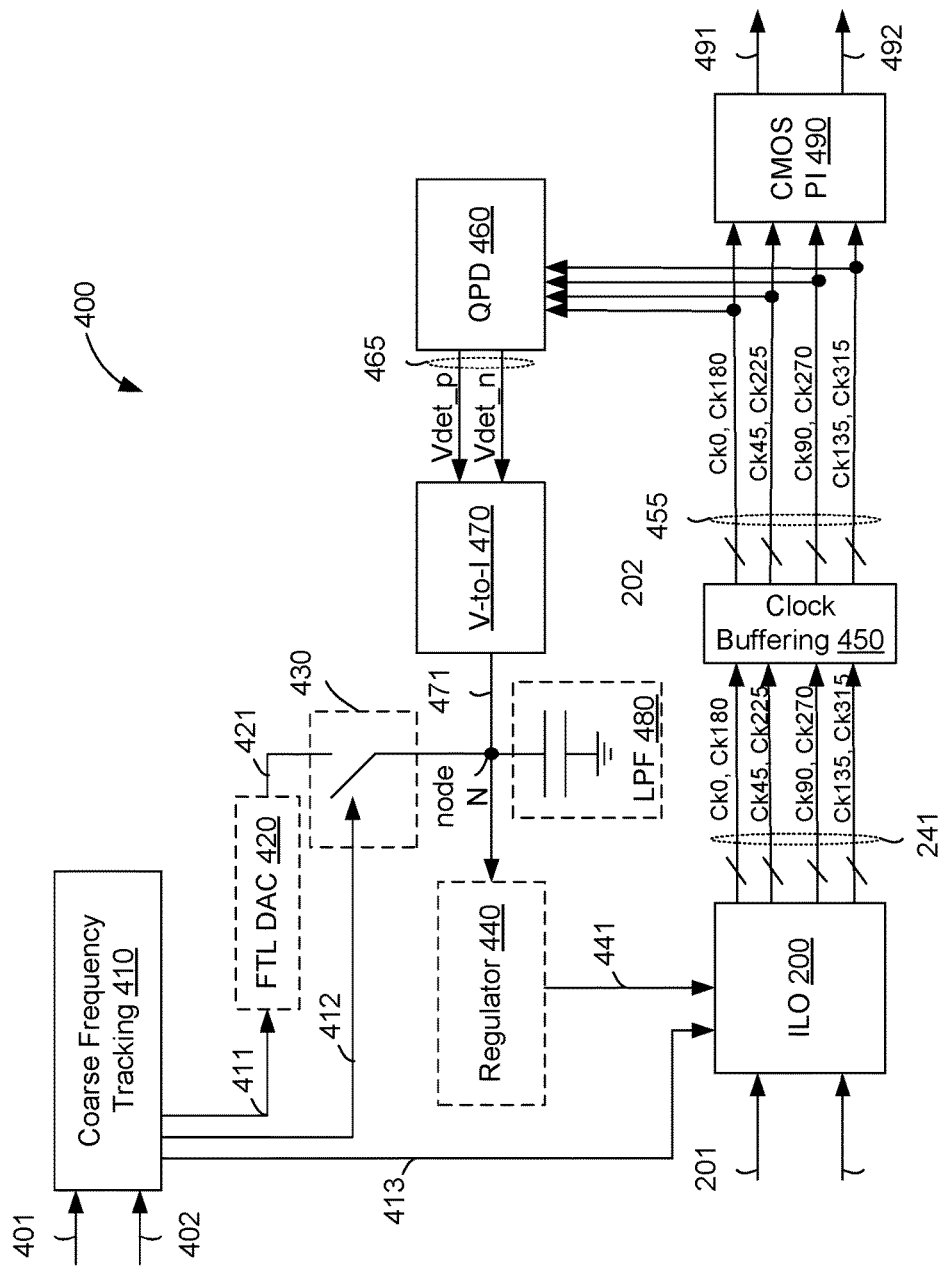
FIG. 4 shows an example frequency tracking loop for an ILO circuit, in accordance with some embodiments.

Accordingly, some example ILO circuits may be incorporated into a frequency tracking loop (FTL) for adjusting the resonant frequency of the ILO circuit to lock to an input clock frequency. For example, FIG. 4 shows an example FTL 400 which may incorporate ILO circuit 200. With respect to FIG. 4, the ILO circuit 200 may receive a first input clock signal 201 and a second input clock signal 202. However, because the frequency of first input clock signal 201 and second input clock signal 202 may not be within the initial locking range of ILO 200, a coarse frequency tracking loop may be used for making coarse adjustments to the oscillation frequency of ILO 200. More particularly, a coarse frequency tracking circuit 410 may receive an injection signal 401 and an oscillation signal 402. The injection signal 401 may be a signal having a frequency corresponding to the frequency of the first and second input clock signals 201 and 202. For example, the injection signal 401 may be one of the first input clock signal 201, the second input clock signal 202, or an output of one of injection stage 210 or injection stage 220. The oscillation signal 402 may be a signal whose frequency corresponds to the oscillation frequency of ILO 200.

The coarse frequency tracking circuit 410 may compare the frequencies of the injection signal 401 and the oscillation signal 402, and determine a coarse control voltage 421 for adjusting the oscillation frequency of the ILO 200. In one implementation, a difference signal 411 based on a frequency difference between the injection signal 401 and the oscillation signal 402 may be provided to a digital to analog converter (FTL DAC) 420. FTL DAC 420 may determine the coarse control voltage 421 for providing the coarse adjustment to the oscillation frequency of ILO 200. A switch 430 may control whether or not the coarse control voltage 421 is provided to the ILO 200. The switch 430 may be controlled by a control signal 412 based at least in part on the frequency difference between injection signal 401 and oscillation signal 402. For example, if the frequency difference exceeds a threshold, the switch 430 may be closed and the coarse control voltage 421 may be provided to the ILO 200. On the other hand, if the frequency difference does not exceed the threshold, the switch 430 may be opened and the coarse control voltage 421 is not provided to the ILO 200. A regulator 440 may suppress a supply noise in the control voltage 441 provided to the ILO 200.

Further, in some implementations a band selection signal 413 may be provided to the ILO 200. The band selection signal 413 may indicate a band of operation for the ILO 200. For example, the ILO 200 may be capable of operating in each of a plurality of bands, where each band corresponds to a different range of frequencies the ILO 200 may be capable of locking to. The band selection signal 413 may indicate the preferred band of operation based on the frequency of the injection signal 401 or the oscillation signal 402.

The coarse frequency tracking circuit 410, FTL DAC 420, switch 430, and regulator 440 may comprise a coarse FTL for providing a coarse adjustment to the oscillation frequency of the ILO 200, for example based upon the coarse control voltage 421. FTL 400 may also include a fine quadrature locked loop (QLL) for providing a fine adjustment to the oscillation frequency of the ILO 200.

More particularly, the fine QLL may include a clock buffering circuit 450, which may receive output signals 241 from ILO 200, as discussed above. For example, the output signals 241 may include 8 delayed clock signals, each signal delayed by one of a plurality of phases. For example, each phase may be separated by a specified phase difference, such as 45 degrees, such that the output signals 241 include signals for a phase difference of 0°, 45°, 90°, and so on. Clock buffering circuit 450 may buffer these output signals 241, and provide them as a plurality of delayed clock signals 455 based on the output signals 241.

The plurality of delayed clock signals 455 may be provided to a quadrature phase detector (QPD) 460. QPD 460 may compare the phases of quadrature pairs of the delayed clock signals 455 to determine their deviation from quadrature. For example, when the delayed clock signals 455 comprise 8 delayed clock signals separated by a phase difference of 45 degrees, the QPD 460 may compare pairs of delayed clock signals such that the clock signal delayed by 0° is compared to the clock signal delayed by 180°, the clock signal delayed by 45° is compared to the clock signal delayed by 225°, and so on. The QPD 460 may generate one or more output signals 465 based at least in part on the determined deviation from quadrature of the pairs of the delayed clock signals 455. For example, the output signals 465 may include differential output signals Vdet_p and Vdet_n. The output signals 465 may be averaged by the V-to-I circuit 470 and the low-pass filter 480 to generate a fine control voltage 471 which is provided to the regulator 440. As noted above, when the frequency difference between injection signal 401 and oscillation signal 402 is less than the threshold, then the switch 430 may be open, and the fine control voltage 471 may be provided to the ILO 200 in lieu of the coarse control voltage 421. Note that while switch 430 is shown positioned between the FTL DAC 420 and a node N of the FTL 400, in other implementations the switch 430 may be positioned differently to selectively couple either the coarse control voltage 421 or the fine control voltage 471 to the ILO 200. For example, the switch 430 may be positioned between node N and the regulator 440.

Thus, the coarse FTL may determine and apply a first adjustment to the running frequency of the ILO 200, bringing the frequency difference between the injection signal 401 and the running frequency of the ILO 200 to within a locking range of the fine QLL. Then, the fine QLL may determine and apply a second adjustment to the running frequency of the ILO 200, such that the injection signal 401 is within the locking range of the ILO 200.

The plurality of delayed clock signals 455 may also be provided to CMOS phase interpolator (PI) 490, which may determine a first output clock signal 491 and a second output clock signal 492. For example, the first output clock signal 491 may include one or more of a digital clock signal DClk and an inverted digital clock signal DClkb. Further, the second output clock signal 492 may include one or more of an external clock signal XClk and an inverted external clock signal XClkb. Note that while FTL 400 of FIG. 4 is depicted as a CMOS implementation, in some other implementations a current mode logic (CML) based implementation may be used instead.

FIG. 5 is an illustrative flowchart of an operation 500 for operating an injection locked oscillator (ILO) circuit, according to some implementations. The operation 500 may be performed by a suitable ILO circuit, such as ILO circuit 200 of FIG. 2. Such an ILO circuit may be incorporated into a suitable FTL circuit, such as FTL 400 of FIG. 4. With respect to FIG. 5, a first input clock signal having a first frequency may be provided to a first clock injection stage including a first programmable inverter in series with a first self-based inverter. The first clock injection stage may generate a first injection signal (502). In some aspects, the first input clock signal may be a first component signal of a differential clock signal pair, and may be provided to a first clock injection stage such as first clock injection stage 210 of FIG. 2. Further, a second input clock signal may be provided to a second clock injection stage including a second programmable inverter in series with a second self-biased inverter. The second input clock signal may also have the first frequency. Further, the second clock injection stage may generate a second injection signal (504). In some aspects, the second input clock signal may be a second component signal of the differential clock signal pair, and may be provided to a second clock injection stage such as second clock injection stage 220 of FIG. 2.

The first injection signal and the second injection signal may be provided to a phase locked loop (PLL) stage comprising a multi-stage ring oscillator. The PLL stage is configured to generate an output clock signal based at least in part on the first frequency (506). In some aspects, the first injection signal and the second injection signal may be provided to a PLL stage such as PLL stage 230 of FIG. 2.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. An injection locked oscillator (ILO) circuit, comprising:
    a first clock injection stage to receive a first input clock signal having a first frequency and to generate a first injection signal based on the first input clock signal, the first clock injection stage including a first programmable inverter in series with a first self-biased inverter;
    a second clock injection stage to receive a second input clock signal having the first frequency and to generate a second injection signal based on the second input clock signal, the second clock injection stage including a second programmable inverter in series with a second self-biased inverter; and
    a phase locked loop (PLL) stage to receive the first injection signal and the second injection signal and to generate an output clock signal based at least in part on the first frequency, the phase locked loop stage including a multi-stage ring oscillator configured to generate the output clock signal based at least in part on the first injection signal and the second injection signal.

2. The ILO circuit of claim 1, wherein the PLL stage further includes a pair of dummy buffers for balancing loading of an oscillator tank of the multi-stage ring oscillator, the pair of dummy buffers comprising:
- a first dummy buffer coupled to a first output of a first stage of the multi-stage ring oscillator; and
- a second dummy buffer coupled to a second output of the first stage of the multi-stage ring oscillator.

3. The ILO circuit of claim 1, wherein the multi-stage ring oscillator further comprises a plurality of non-cross-coupled inverters and a plurality of cross-coupled programmable inverters.

4. The ILO circuit of claim 1, wherein the PLL stage is further configured to receive a control voltage input for controlling an oscillation frequency of the PLL stage.

5. The ILO circuit of claim 4, further comprising a coarse frequency tracking circuit to compare the first frequency with the oscillation frequency of the PLL stage and to determine a coarse control voltage for controlling the oscillation frequency of the PLL stage, wherein the coarse control voltage is configured to reduce a difference between the oscillation frequency of the PLL stage and the first frequency.

6. The ILO circuit of claim 5, wherein the clock output signal comprises a plurality of delayed clock signals; and
wherein the ILO circuit further comprises a fine quadrature locked loop (QLL) stage, comprising:
- a quadrature phase detector (QPD) circuit to receive the plurality of delayed clock signals and to determine a fine control voltage for controlling the oscillation frequency of the PLL stage, wherein the fine control voltage is based on the plurality of delayed clock signals and configured to reduce a difference between the oscillation frequency of the PLL stage and the first frequency.

7. The ILO circuit of claim 6, wherein the PLL stage is selectively coupled to receive the coarse control voltage or the fine control voltage as the control voltage input based on the difference between the first frequency and the oscillation frequency of the PLL stage.

8. The ILO circuit of claim 6, wherein the plurality of delayed clock signals comprises eight delayed clock signals, each of the eight delayed clock signals delayed in phase by an integer multiple of 45 degrees.

9. The ILO circuit of claim 6, wherein the fine QLL stage further comprises a voltage regulator to suppress a supply noise in the control voltage input.

10. The ILO circuit of claim 6, wherein the fine QLL stage is configured to reduce the difference between the oscillation frequency of the PLL stage and the first frequency to within a locking range of the ILO circuit.

11. A method for operating an injection locked oscillator (ILO) circuit, comprising:
- providing a first input clock signal, having a first frequency, to a first clock injection stage including a first programmable inverter in series with a first self-biased inverter, and generating a first injection signal using the first clock injection stage;
- providing a second input clock signal, having the first frequency, to a second clock injection stage including a second programmable inverter coupled to a second self-biased inverter, and generating a second injection signal using the second clock injection stage;
- providing the first injection signal and the second injection signal to a phase locked loop (PLL) stage configured to generate an output clock signal based at least in part on the first frequency, the PLL stage comprising a multi-stage ring oscillator.

12. The method of claim 11, wherein the PLL stage further comprises a pair of dummy buffers for balancing loading of an oscillator tank of the multi-stage ring oscillator.

13. The method of claim 11, wherein the multi-stage ring oscillator further comprises a plurality of non-cross-coupled inverters and a plurality of cross-coupled programmable inverters.

14. The method of claim 11, wherein the phase locked loop stage further comprises a control input to receive a control voltage for controlling an oscillation frequency of the PLL stage.

15. The method of claim 14, further comprising:
- comparing the first frequency with the oscillation frequency of the PLL stage; and
- generating a coarse control voltage for coupling to the control input based on the comparing, the coarse control voltage to reduce a difference between the oscillation frequency of the PLL stage and the first frequency.

16. The method of claim 15, further comprising:
- generating a plurality of delayed clock signals, by delaying the output clock signal by a plurality of phases; and
- determining, using a quadrature phase detector (QPD) circuit, a fine control voltage for controlling the oscillation frequency of the PLL stage, wherein the fine control voltage is based on the plurality of delayed clock signals to reduce a difference between the oscillation frequency of the PLL stage and the first frequency.

17. The method of claim 16, further comprising selectively coupling the PLL stage to receive either the coarse control voltage or the fine control voltage as the control input based on the difference between the first frequency and the oscillation frequency of the PLL stage.

18. The method of claim 16, wherein the plurality of delayed clock signals comprises eight delayed clock signals, each of the eight delayed clock signals delayed in phase by an integer multiple of 45 degrees.

19. The method of claim 16, further comprising reducing, using a voltage regulator, a supply noise in the control voltage.

20. An injection locked oscillator (ILO) circuit, comprising:
- means for providing a first input clock signal, having a first frequency, to a first clock injection stage including a first programmable inverter in series with a first self-biased inverter, and generating a first injection signal based on the first input clock signal;
- means for providing a second input clock signal, having the first frequency, to a second clock injection stage including a second programmable inverter in series with a second self-biased inverter, and generating a second injection signal based on the second input clock signal;
- means for providing the first injection signal and the second injection signal to a phase locked loop (PLL) stage configured to generate an output clock signal based at least in part on the first frequency, the PLL stage comprising a multi-stage ring oscillator.

* * * * *